(12) United States Patent
Bushard et al.

(10) Patent No.: US 7,844,869 B2
(45) Date of Patent: Nov. 30, 2010

(54) IMPLEMENTING ENHANCED LBIST TESTING OF PATHS INCLUDING ARRAYS

(75) Inventors: Louis Bernard Bushard, Rochester, MN (US); Todd Alan Christensen, Rochester, MN (US); Jesse Daniel Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 12/015,254

(22) Filed: Jan. 16, 2008

(65) Prior Publication Data

US 2009/0183044 A1 Jul. 16, 2009

(51) Int. Cl.
*G01R 31/28* (2006.01)
(52) U.S. Cl. .................. 714/724; 714/718; 714/30; 714/25; 714/733; 714/726; 714/727; 714/728; 714/729; 714/732; 714/734; 714/735; 714/736; 714/738; 714/739

(58) Field of Classification Search .................. None
See application file for complete search history.

(56) References Cited

U.S. PATENT DOCUMENTS

| 2005/0097418 A1* | 5/2005 | Anzou et al. ............ 714/733 |
| 2006/0080584 A1* | 4/2006 | Hartnett et al. .......... 714/733 |
| 2006/0156090 A1* | 7/2006 | Bushard et al. .......... 714/718 |

* cited by examiner

*Primary Examiner*—John P Trimmings
(74) *Attorney, Agent, or Firm*—Joan Pennington

(57) ABSTRACT

A method and circuit implement testing of a circuit path including a memory array and logic including Logic Built in Self Test (LBIST) diagnostics, and a design structure on which the subject circuit resides are provided. Testing of the circuit path includes initializing the memory array in the circuit path with an initialization pattern, switching to Logic Built in Self Test (LBIST) mode and providing a read only mode for the memory array, and running Logic Built in Self Test (LBIST) testing of the circuit path.

19 Claims, 10 Drawing Sheets

500

EXEMPLARY INITIALIZATION PATTERN
FOR MEMORY ARRAY

|  | DATA 0 | DATA 1 | DATA 2 | DATA 3 | * | * | * | DATA N-3 | DATA N-2 | DATA N-1 | DATA N |
|---|---|---|---|---|---|---|---|---|---|---|---|
| ENTRY N | 1 | 1 | 0 | 0 | 0 | 0 | 1 | 1 | 0 | 0 | 1 |
| ENTRY N-1 | 0 | 1 | 1 | 0 | 0 | 1 | 0 | 1 | 1 | 1 | 1 |
| * | 1 | 0 | 1 | 0 | * | * | * | 1 | 0 | 1 | 0 |
| * | 0 | 1 | 0 | 1 | * | * | * | 0 | 1 | 0 | 1 |
| ENTRY 1 | 1 | 1 | 1 | 1 | 1 | 1 | 1 | 1 | 1 | 1 | 1 |
| ENTRY 0 | 0 | 0 | 0 | 0 | 0 | 0 | 0 | 0 | 0 | 0 | 0 |

IMPLEMENTING ENHANCED LBIST TESTING OF PATHS INCLUDING ARRAYS

CONTRACTUAL ORIGIN OF THE INVENTION

This invention was made with United States Government support under Agreement No. HR0011-07-9-0002 awarded by DARPA. The Government has certain rights in the invention.

FIELD OF THE INVENTION

The present invention relates generally to the data processing field, and more particularly, relates to a method and circuit for implementing testing of a circuit path including a memory array and logic including Logic Built in Self Test (LBIST) diagnostics, and a design structure on which the subject circuit resides.

DESCRIPTION OF THE RELATED ART

When testing integrated circuits, known techniques such as Array Built In Self Test (ABIST) and Logic Built in Self Test (LBIST) diagnostics are used to test memory arrays and logic.

It is very important to be able test the full latch-to-latch paths that are used in the chip function at the same frequency that will be used in the system application.

If the circuits are tested at a slower frequency or part of the functional path is bypassed then there could be AC defects that would not be caught by test but result in a failing chip when exercised in the system. This is a very expensive point to identify failing parts. Also at speed AC test of the full functional path can be used to perform sorting of chips into different frequency bins, which is very desirable to optimize yield of useable chips.

FIG. 1A illustrates a prior art circuit path for implementing known Array Built In Self Test (ABIST) testing techniques with a latch-bounded array. Sometimes arrays are designed to be latch bounded. There are latches at all the address and data input pins and latches at the data output pins. The array typically has 1 clock cycle to perform a read access and have the data captured in the output latch. The data outputs would be launched out of the array on the subsequent cycle.

ABIST testing of the arrays is very straightforward when testing latch-bounded arrays. ABIST will test the entire path and if ABIST is run at system speed, AC defects will be caught.

FIGS. 1B and 1C illustrate other circuit paths 100, 120 with arrays 102 and logic 104 where the paths are not just a latch-bounded array as shown in FIG. 1A. In such circuit paths 100, 120, logic 104 may be placed after or in front of the array 102 as shown in FIGS. 1B and 1C and testing the full latch-to-latch paths is more complex. For arrays that are not output latch bounded, typically observation latches, such as latches 110, 112 are provided so that ABIST test is straightforward for partial AC paths as shown in FIGS. 1B and 1C but ABIST is not testing the full AC paths since the logic in front of the array or downstream logic is not tested along with the array path.

For LBIST, typically random patterns are scanned into banks of latches surrounding random logic and then the logic is functionally clocked and the capture latches are scanned out and the data is compressed and the results are compared with a signature to tell if there are any AC or DC defects. LBIST in this manner is a very well understood and inexpensive way to AC and DC test integrated circuits.

Known tools used for generating patterns and expects for paths that contain memory arrays mixed with logic currently require very long, onerous execution times when solving this type of problem since the tool must keep track of sequential changing of the memory arrays.

In a known level sensitive scan design (LSSD) test process, a pseudo-random pattern generator (PRPG) and a multiple input signature register (MISR) are provided with a test control module (TCM) used to operate in the LSSD scan mode. A prior art LSSD testing arrangement is STUMPS (Self-Test Using a MISR and a Parallel Shift register sequence generator). Fault simulation in LBIST is virtually intractable because of the need to retain the memory state across STUMPS loads.

A need exists to test the full AC latch-to-latch path that includes a memory array and logic.

SUMMARY OF THE INVENTION

Principal aspects of the present invention are to provide a method and circuit for implementing testing of a circuit path including a memory array and logic including Logic Built in Self Test (LBIST) diagnostics, and a design structure on which the subject circuit resides. Other important aspects of the present invention are to provide such method and circuit substantially without negative effect and that overcome many of the disadvantages of prior art arrangements.

In brief, a method and circuit for implementing testing of a circuit path including a memory array and logic including Logic Built in Self Test (LBIST) diagnostics, and a design structure on which the subject circuit resides are provided. Testing of the circuit path includes initializing the memory array in the circuit path with an initialization pattern, switching to Logic Built in Self Test (LBIST) mode and providing a read only mode for the memory array, and running Logic Built in Self Test (LBIST) testing of the circuit path.

In accordance with features of the invention, the initialization pattern is deterministic and is based upon the logic included with the memory array in the circuit path. The deterministic initialization pattern is programmed into the memory, enabling an update with special patterns based on manufacturing or lab test results.

BRIEF DESCRIPTION OF THE DRAWINGS

The present invention together with the above and other objects and advantages may best be understood from the following detailed description of the preferred embodiments of the invention illustrated in the drawings, wherein:

FIG. 5 is a diagram illustrating an exemplary initialization pattern that is deterministic and depends upon the logic in the circuit path under test for implementing testing of circuit paths including a memory array and logic including Logic Built in Self Test (LBIST) diagnostics in accordance with the preferred embodiment;

DETAILED DESCRIPTION OF THE PREFERRED EMBODIMENTS

In accordance with features of the invention, a method is provided that tests a full AC latch-to-latch path that includes a memory array and logic. The method of the invention includes initializing the memory array into a deterministic pattern. Then when entering LBIST mode the memory array is forced into a read-only state. Then run LBIST as normal with the memory array treated as a Read Only Memory (ROM). The LBIST pattern generator and expect tool now does not have to keep track of sequential changing of the memory and the access of the memory exactly matches the read timing which will accurately catch AC defects. ROMs are handled easily by test pattern generation and fault simulation tools. In such tools, ROMs look like MUX trees with constant inputs.

Figure 1A:
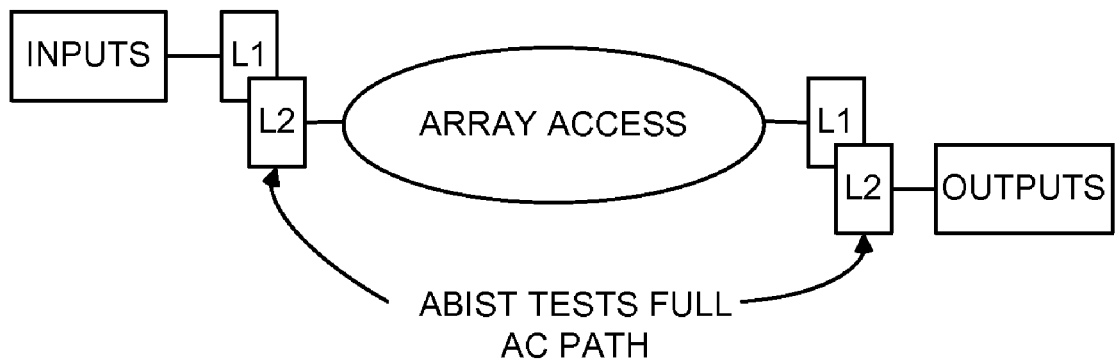
FIG. 1A is a diagram illustrating a prior art circuit path for implementing known testing techniques such as Array Built In Self Test (ABIST) diagnostics with a latch-bounded array.
Figure 1B:
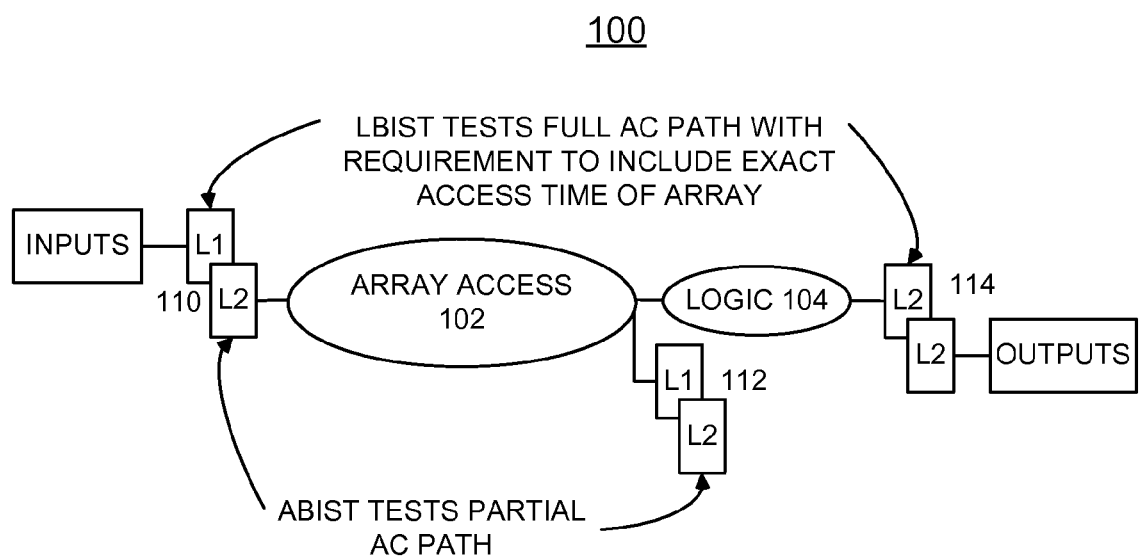
FIGS. 1B, and 1C are diagrams illustrating respective circuit paths including a memory array and logic for implementing known testing techniques of Array Built In Self Test (ABIST) tests for a partial AC path, and Logic Built in Self Test (LBIST) diagnostics for a full AC path with requirement to include exact access time of array in accordance with the preferred embodiment.
Figure 1C:
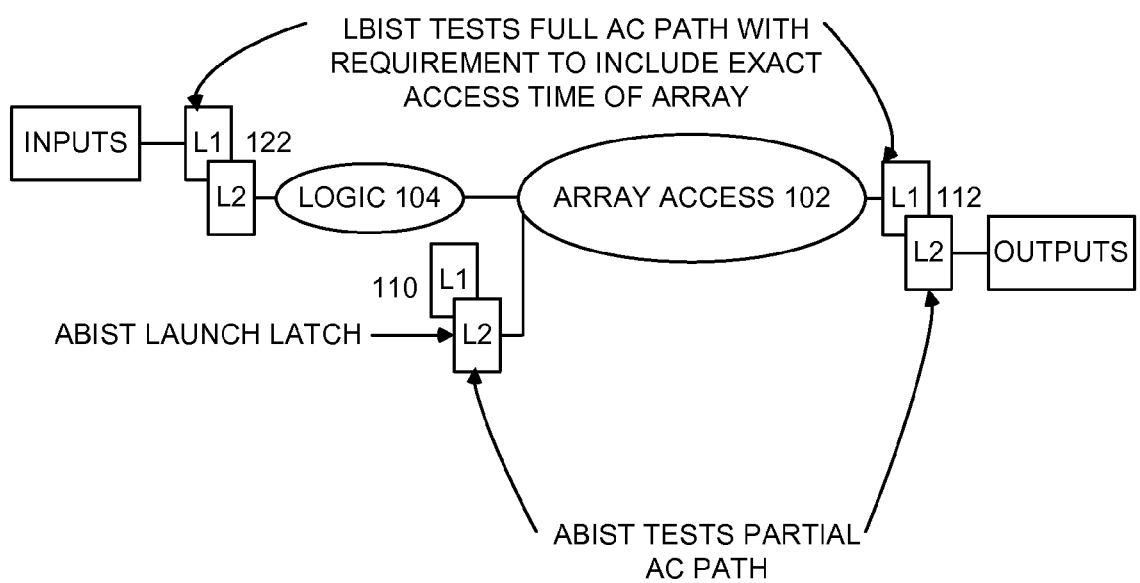

FIGS. 1B, and 1C illustrate respective circuit paths 100, 120 to be tested using the method of the invention. Circuit path 100 includes a memory array 102 and downstream logic 104 shown in FIG. 1B. Circuit path 120 includes a memory array 102 and upstream logic 104 shown in FIG. 1C. Logic Built in Self Test (LBIST) diagnostics for the respective full AC path 100, 120 are implemented with the requirement to include exact access time of memory array 102 in accordance with the preferred embodiment. Input latches 110 and output latches 112 are provided with the memory array 102 for implementing known testing techniques of Array Built In Self Test (ABIST) tests for a partial AC path. Circuit path 100 includes output latches 114 at the output of downstream logic 104 used with the array input latches 110 for LBIST testing the full AC latch-to-latch path 100. Circuit path 120 includes input latches 122 at the input of upstream logic 104 used with the array output latches 112 for LBIST testing the full AC latch-to-latch path 120.

Figure 2:
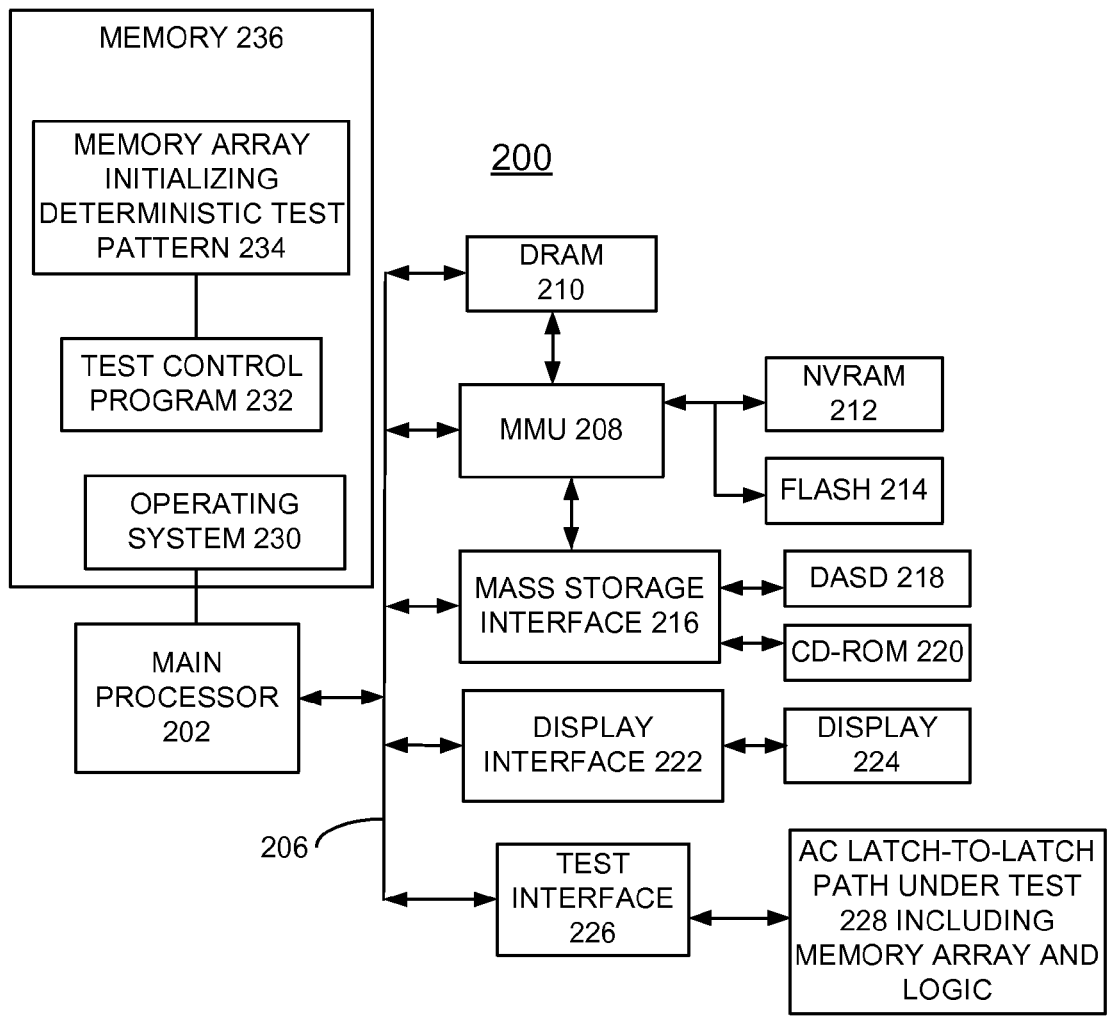
FIG. 2 is a block diagram representation illustrating an exemplary computer test system for implementing testing of circuit paths including a memory array and logic including Logic Built in Self Test (LBIST) diagnostics in accordance with the preferred embodiment.

Having reference now to the drawings, in FIG. 2, there is shown an exemplary computer test system for implementing testing of circuit paths including arrays including Logic Built in Self Test (LBIST) diagnostics generally designated by the reference character 200 in accordance with the preferred embodiment. Computer system 200 includes a main processor 202 or central processor unit (CPU) 202 coupled by a system bus 206 to a memory management unit (MMU) 208 and system memory including a dynamic random access memory (DRAM) 210, a nonvolatile random access memory (NVRAM) 212, and a flash memory 214. A mass storage interface 216 coupled to the system bus 206 and MMU 208 connects a direct access storage device (DASD) 218 and a CD-ROM drive 210 to the main processor 202. Computer system 200 includes a display interface 222 connected to a display 224, and a test interface 226 coupled to the system bus 206. An AC latch-to-latch path under test 228 including memory array and logic is coupled to the test interface 226. The AC latch-to-latch path under test 228 includes, for example, a test path as illustrated in FIGS. 1B and 1C. Computer system 200 includes an operating system 230, a test control program 232, and a memory array initializing deterministic test pattern 234 of the preferred embodiment resident in a memory 236.

Computer test system 200 is shown in simplified form sufficient for understanding the present invention. The illustrated computer test system 200 is not intended to imply architectural or functional limitations. The present invention can be used with various hardware implementations and systems and various other internal hardware devices, for example, multiple main processors.

Figure 3:
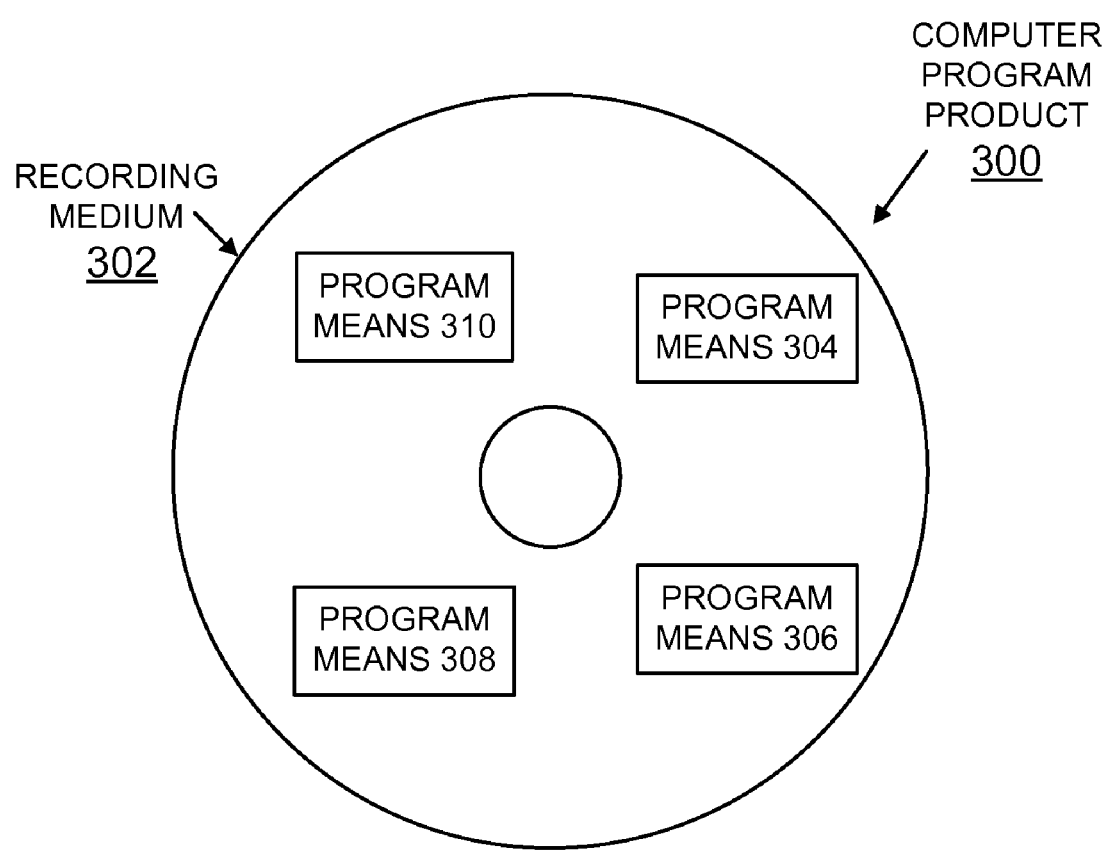
FIG. 3 is a block diagram illustrating a computer program product in accordance with the preferred embodiment.

Referring now to FIG. 3, an article of manufacture or a computer program product 300 of the invention is illustrated. The computer program product 300 includes a recording medium 302, such as, a floppy disk, a high capacity read only memory in the form of an optically read compact disk or CD-ROM, a tape, or another similar computer program product. Recording medium 302 stores program means 304, 306, 308, 310 on the medium 302 for carrying out the methods for implementing testing of circuit paths including arrays including Logic Built in Self Test (LBIST) diagnostics of the preferred embodiment in the system 200 of FIG. 2.

A sequence of program instructions or a logical assembly of one or more interrelated modules defined by the recorded program means 304, 306, 308, 310, direct the computer system 200 for implementing testing of circuit paths including arrays including Logic Built in Self Test (LBIST) diagnostics of the preferred embodiment.

Figure 4:
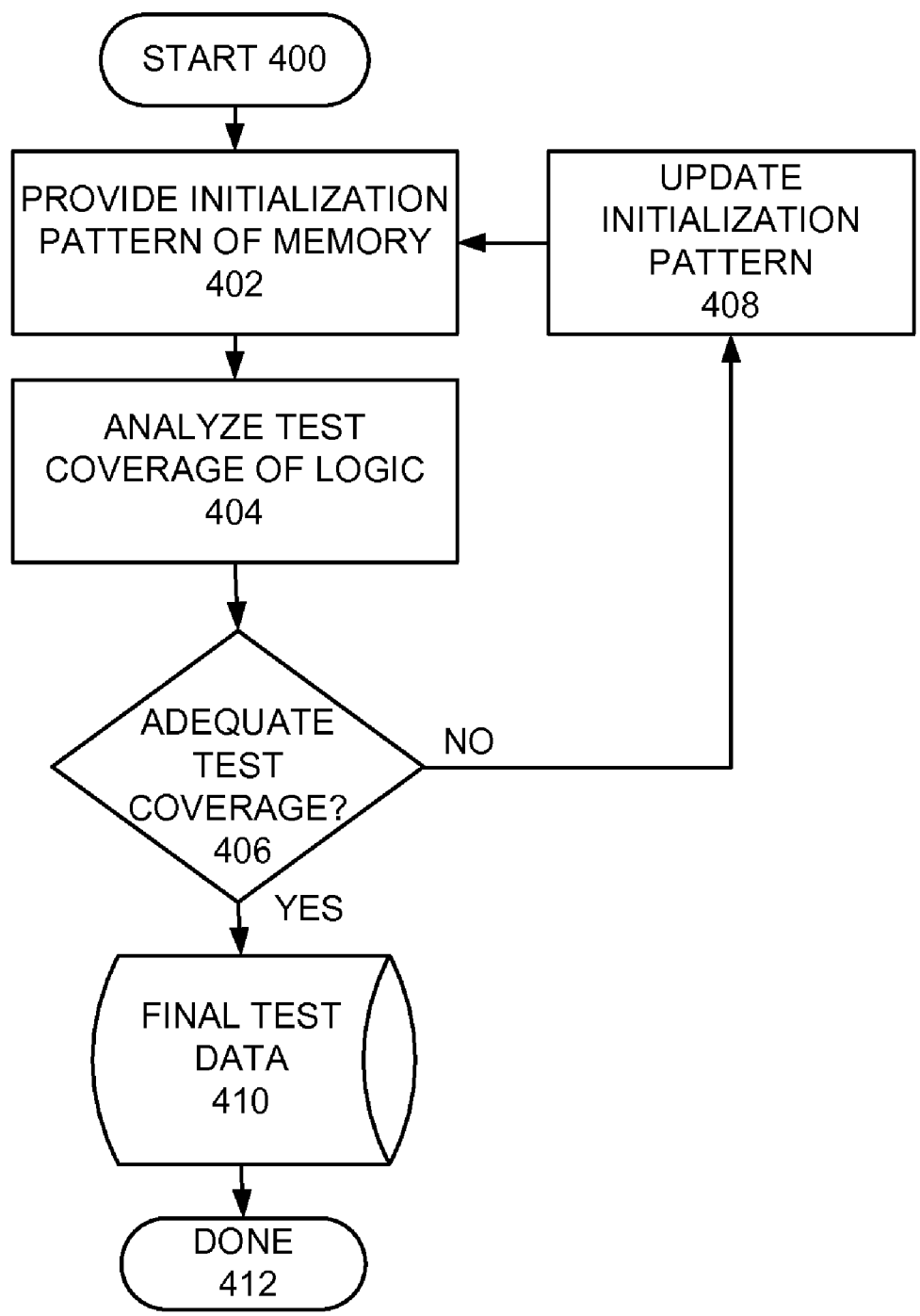
FIG. 4 is a flow chart illustrating exemplary steps for implementing testing of circuit paths including a memory array and logic including Logic Built in Self Test (LBIST) diagnostics in accordance with the preferred embodiment.

FIG. 4 is a flow chart illustrating exemplary steps for implementing testing of circuit paths including a memory array and logic including Logic Built in Self Test (LBIST) diagnostics in accordance with the preferred embodiment starting at a block 400. First an initialization pattern of memory is provided as indicated at a block 402. Test coverage of the logic in the circuit path is analyzed with the provided initialization pattern of memory as indicated at a block 404. It is determined whether adequate test coverage of the logic is provided as indicated at a decision block 406.

Depending upon the downstream logic, there could be a test coverage issue if the patterns driving the logic are too simple. A memory that contained blanket data, checkerboards and stripes of data could result in inadequate test coverage of the downstream logic. During LBIST random or pseudo-random data is needed on the array outputs to be able to adequately test the downstream logic.

If inadequate test coverage is identified at decision block 406, then the initialization pattern is updated as indicated at a block 408 and the sequential steps are repeated. When adequate test coverage is identified at decision block 406, then the final test data is provided as indicated at a block 410. Sequential steps are completed as indicated at a block 412.

FIG. 5 is a diagram illustrating an exemplary initialization pattern generally designated by the reference character 500 for implementing testing of circuit paths including a memory array and logic including Logic Built in Self Test (LBIST) diagnostics in accordance with the preferred embodiment.

Initialization pattern 500 is deterministic and depends upon the logic in the circuit path under test. Initialization pattern 500 includes a plurality of entries 0-N, each entry including data 0-N. As shown, the initialization pattern 500 includes an entry 0 of all data values of 0s, and an entry 1 of all data values of 1s, and entries 2-N including a combination of data values of 0s and 1s.

In accordance with features of the invention, the initialization pattern 500 illustrates one possible initialization pattern that is deterministic and depends upon the downstream logic of the memory array. For instance if there are many AND books in the logic then the entries would favor a high number of 1s to be able to sensitize the logic for fault detection. Since any deterministic initialization can be programmed into the memory, this allows for update of special patterns based on manufacturing or lab test results. This invention allows for loading different new data than standard ABIST pattern data where the new data is effective for unique downstream logic.

Figure 6:
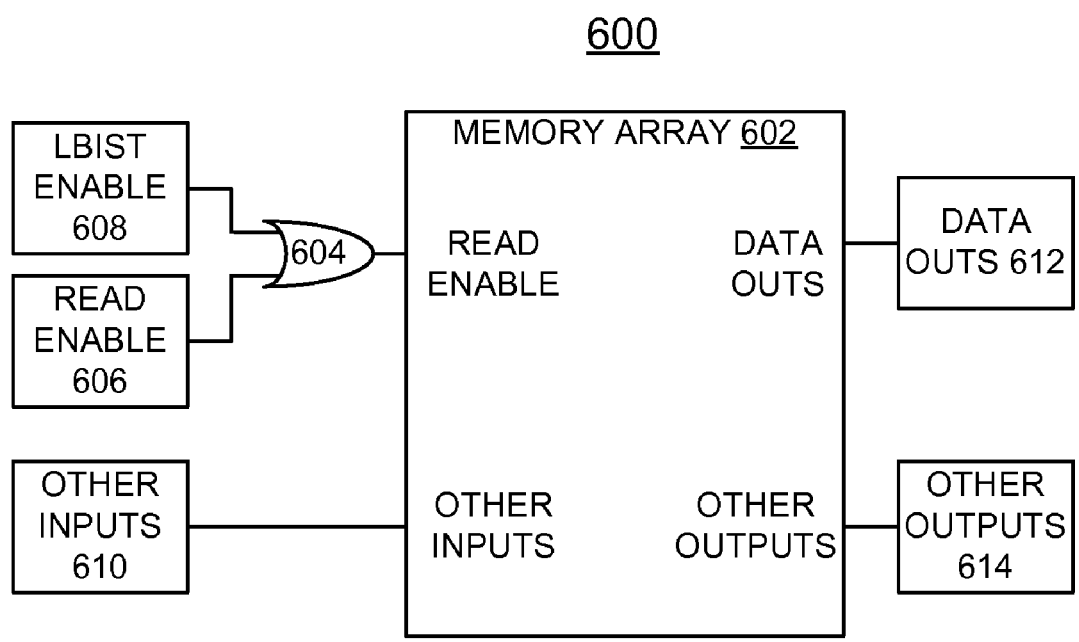
FIG. 6 is a diagram illustrating an exemplary memory array together with exemplary gating logic for implementing testing of circuit paths including a memory array and logic including Logic Built in Self Test (LBIST) diagnostics in accordance with the preferred embodiment.

FIG. 6 is a diagram illustrating an exemplary memory array system generally designated by the reference character 600 including a memory array 602 and exemplary gating logic 604, 606, 608 for implementing testing of circuit paths including a memory array and logic including Logic Built in Self Test (LBIST) diagnostics in accordance with the preferred embodiment. The memory array system 600 includes gating logic 604, 606, 608 added to the memory array to force the memory into a Read-Only during LBIST. As shown, memory array system 600 includes an OR gate 604 receiving a pair of inputs of a Read enable 606 and an LBIST enable 608. The output of the OR gate 604 is applied to a read enable input of memory array 602 with other inputs 610 applied to other inputs of memory array 602. Memory array 602 includes data outs applied to data outs 612 for testing and other data outputs applied to data outputs 614.

Figure 7:
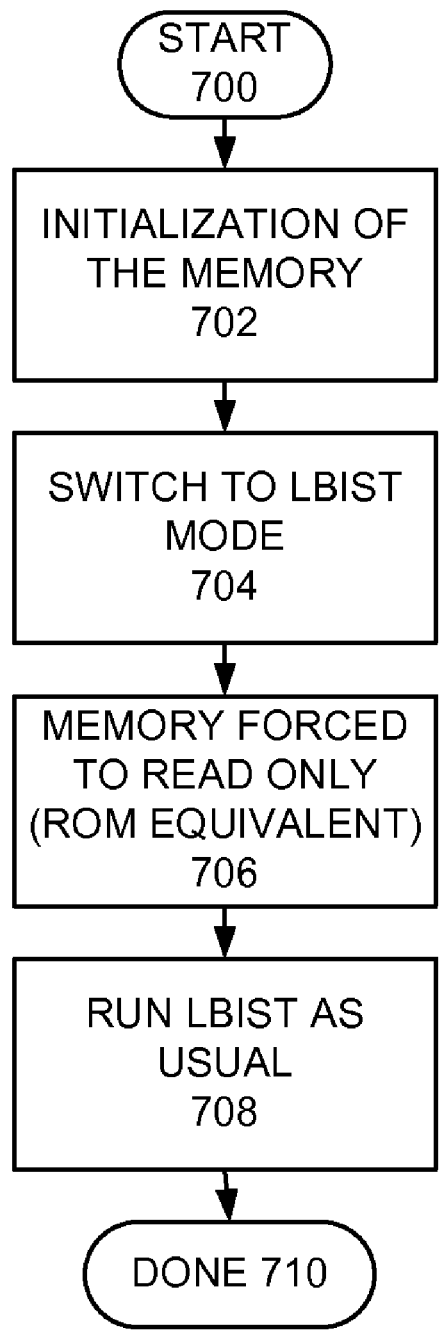
FIG. 7 is a flow chart illustrating exemplary steps for implementing testing of circuit paths including a memory array and logic including Logic Built in Self Test (LBIST) diagnostics in accordance with the preferred embodiment.

FIG. 7 is a flow chart illustrating exemplary steps for implementing testing of circuit paths including a memory array and logic including Logic Built in Self Test (LBIST) diagnostics in accordance with the preferred embodiment starting at a block 700. First an initialization of memory, such as memory array 602, is provided as indicated at a block 702. Then testing switches to the LBIST mode as indicated at a block 704. The memory 602 is forced to a read only, or ROM equivalent as indicated at a block 706. Thus, the test model is created by replacing a read/write memory model with a read only memory model. Then LBIST diagnostics are run including AC and DC testing of the circuit path in accordance with the preferred embodiment as indicated at a block 708.

In accordance with features of the invention, the LBIST testing includes scanning random patterns into the circuit path including the memory array and logic and then the logic is functionally clocked and the capture latches are scanned out and the data is compressed and the results are compared with a signature to tell if there are any AC or DC defects. With the memory array in the read only mode, an LBIST pattern generator and expect tool does not have to keep track of sequential changing of the memory and the access of the memory exactly matches the read timing which will accurately catch AC defects. Sequential steps are completed as indicated at a block 710.

Figure 8:
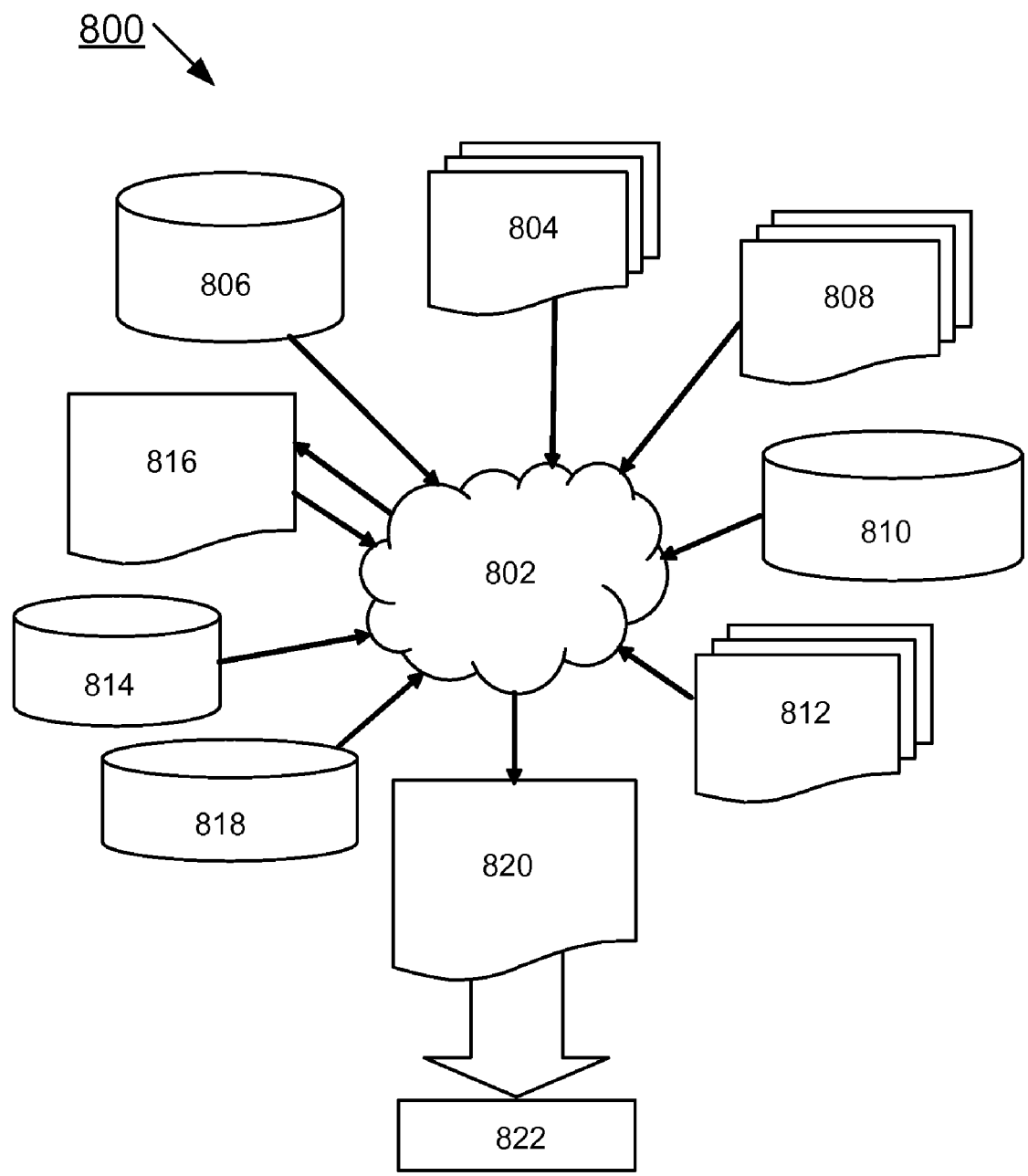
FIG. 8 is a flow diagram of a design process used in semiconductor design, manufacturing, and/or test.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 802 is preferably an input to a design process 804 and may come from an IP provider, a core developer, or other design company or may be generated by the operator of the design flow, or from other sources. Design structure 802 comprises circuits 200, 600 in the form of schematics or HDL, a hardware-description language, for example, Verilog, VHDL, C, and the like. Design structure 802 may be contained on one or more machine readable medium. For example, design structure 802 may be a text file or a graphical representation of circuits 200, 600. Design process 804 preferably synthesizes, or translates, circuits 200, 600 into a netlist 806, where netlist 806 is, for example, a list of wires, transistors, logic gates, control circuits, I/O, models, etc. that describes the connections to other elements and circuits in an integrated circuit design and recorded on at least one of machine readable medium. This may be an iterative process in which netlist 806 is resynthesized one or more times depending on design specifications and parameters for the circuits.

Design process 804 may include using a variety of inputs; for example, inputs from library elements 808 which may house a set of commonly used elements, circuits, and devices, including models, layouts, and symbolic representations, for a given manufacturing technology, such as different technology nodes, 32 nm, 45 nm, 90 nm, and the like, design specifications 810, characterization data 812, verification data 814, design rules 816, and test data files 818, which may include test patterns and other testing information. Design process 804 may further include, for example, standard circuit design processes such as timing analysis, verification, design rule checking, place and route operations, and the like. One of ordinary skill in the art of integrated circuit design can appreciate the extent of possible electronic design automation tools and applications used in design process 804 without deviating from the scope and spirit of the invention. The design structure of the invention is not limited to any specific design flow.

Design process 804 preferably translates an embodiment of the invention as shown in FIGS. 1B, 1C, 2, and 6 along with any additional integrated circuit design or data (if applicable), into a second design structure 820. Design structure 820 resides on a storage medium in a data format used for the exchange of layout data of integrated circuits, for example, information stored in a GDSII (GDS2), GL1, OASIS, or any other suitable format for storing such design structures. Design structure 820 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1B, 1C, 2, and 6. Design structure 820 may then proceed to a stage 822 where, for example, design structure 820 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing testing of a circuit path including a memory array and logic comprising the steps of:
    providing an initialization pattern to the memory array in the circuit path;
    switching to Logic Built in Self Test (LBIST) mode;
    applying read only mode for the memory array; and
    running Logic Built in Self Test (LBIST) testing of the circuit path; and
    wherein switching to Logic Built in Self Test (LBIST) mode and applying read only mode for the memory array includes providing an OR gate coupled to the memory array and applying an LBIST enable signal and a read enable signal to said OR gate.

2. The method for implementing testing of a circuit path as recited in claim 1 wherein providing an initialization pattern to the memory array includes providing a deterministic initialization pattern based upon the logic in the circuit path.

3. The method for implementing testing of a circuit path as recited in claim 1 wherein providing an initialization pattern includes analyzing test coverage of the logic in the circuit path.

4. The method for implementing testing of a circuit path as recited in claim 3 further includes updating the initialization pattern responsive to inadequate test coverage of the logic in the circuit path.

5. The method for implementing testing of a circuit path as recited in claim 3 further includes providing final test data responsive to adequate test coverage of the logic in the circuit path.

6. The method for implementing testing of a circuit path as recited in claim 1 wherein running Logic Built in Self Test (LBIST) testing of the circuit path includes AC and DC testing of the circuit path.

7. The method for implementing testing of a circuit path as recited in claim 1 wherein running Logic Built in Self Test (LBIST) testing of the circuit path includes access of the memory array that exactly matches the read timing, eliminating any sequential changing of the memory array with the memory array in the read only mode.

8. A circuit for implementing testing of a circuit path including a memory array and logic comprising:
   an OR gate coupled to the memory array;
   an LBIST enable logic applying an LBIST enable logic signal to said OR gate;
   a read enable logic applying a read enable signal to said OR gate;
   a memory storing an initialization pattern for the memory array in the circuit path; said memory storing a test control program;
   a processor executing said test control program for applying said initialization pattern to the memory array in the circuit path; said test control program for switching to Logic Built in Self Test (LBIST) mode; said test control program for applying read only mode for the memory array; and said test control program for running Logic Built in Self Test (LBIST) testing of the circuit path.

9. The circuit for implementing testing of a circuit path as recited in claim 8 wherein said initialization pattern for the memory array is a deterministic initialization pattern based upon the logic in the circuit path.

10. The circuit for implementing testing of a circuit path as recited in claim 8 wherein said storing said initialization pattern includes said test control program analyzing test coverage of the logic in the circuit path.

11. The circuit for implementing testing of a circuit path as recited in claim 10 further includes said test control program updating the initialization pattern responsive to inadequate test coverage of the logic in the circuit path.

12. The circuit for implementing testing of a circuit path as recited in claim 10 further includes said test control program providing final test data responsive to adequate test coverage of the logic in the circuit path.

13. The circuit for implementing testing of a circuit path as recited in claim 8 wherein said test control program running Logic Built in Self Test (LBIST) testing of the circuit path includes said test control program running AC and DC testing of the circuit path.

14. A design structure embodied in a machine readable medium used in a design process, the design structure comprising:
   an OR gate coupled to a memory array;
   an LBIST enable logic applying an LBIST enable logic signal to said OR gate;
   a read enable logic applying a read enable signal to said OR gate;
   a memory storing an initialization pattern for the memory array in a circuit path; said memory storing a test control program;
   a processor executing said test control program for applying said initialization pattern to the memory array in the circuit path; said test control program for switching to Logic Built in Self Test (LBIST) mode; said test control program for applying read only mode for the memory array; and said test control program for running Logic Built in Self Test (LBIST) testing of the circuit path.

15. The design structure of claim 14, wherein the design structure comprises a netlist, which describes the circuit path.

16. The design structure of claim 14, wherein the design structure resides on a storage medium as a data format used for the exchange of layout data of integrated circuits.

17. The design structure of claim 14, wherein the design structure includes at least one of test data files, characterization data, verification data, or design specifications.

18. The design structure of claim 14, wherein said initialization pattern for the memory array is a deterministic initialization pattern based upon the logic in the circuit path.

19. The design structure of claim 14, wherein said test control program running Logic Built in Self Test (LBIST) testing of the circuit path includes said test control program running AC and DC testing of the circuit path.

* * * * *